United States Patent
Cervini

(10) Patent No.: US 7,099,293 B2
(45) Date of Patent: Aug. 29, 2006

(54) BUFFER-LESS DE-SKEWING FOR SYMBOL COMBINATION IN A CDMA DEMODULATOR

(75) Inventor: Stefano Cervini, La Jolla, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 957 days.

(21) Appl. No.: 10/136,650

(22) Filed: May 1, 2002

(65) Prior Publication Data
US 2003/0206560 A1 Nov. 6, 2003

(51) Int. Cl.
*H04B 7/216* (2006.01)
(52) U.S. Cl. .................. 370/335; 370/342; 375/142; 375/150
(58) Field of Classification Search .............. 370/329, 370/335, 342, 341, 431, 441; 375/142, 150
See application file for complete search history.

(56) References Cited
U.S. PATENT DOCUMENTS
5,654,979 A 8/1997 Levin et al. ............... 375/206

| | | | |
|---|---|---|---|
| 2002/0051506 A1* | 5/2002 | Deas et al. | 375/355 |
| 2003/0142772 A1* | 7/2003 | Weiss et al. | 375/372 |
| 2004/0091038 A1* | 5/2004 | Agazzi et al. | 375/233 |
| 2005/0084026 A1* | 4/2005 | Agazzi | 375/265 |
| 2006/0034402 A1* | 2/2006 | Azazzi et al. | 375/348 |

\* cited by examiner

*Primary Examiner*—Ajit Patel
(74) *Attorney, Agent, or Firm*—Lisa K. Jorgenson; Andre M. Szuwalski

(57) ABSTRACT

A demodulator in a wireless communication network for combining symbols without the need to store the received symbols in buffers for subsequent retrieval and accumulation. The demodulator includes a plurality of accumulators capable of accumulating received symbols, each symbol associated with a physical channel and a propagation path. The demodulator includes a multiplexer for routing the received symbols to an appropriate accumulator selected from the plurality of accumulators. The symbols received from different propagation paths are each routed and accumulated to an appropriate accumulator based on a physical channel of the received symbol and a value of an indicator associated with a propagation path of the received symbol.

25 Claims, 8 Drawing Sheets

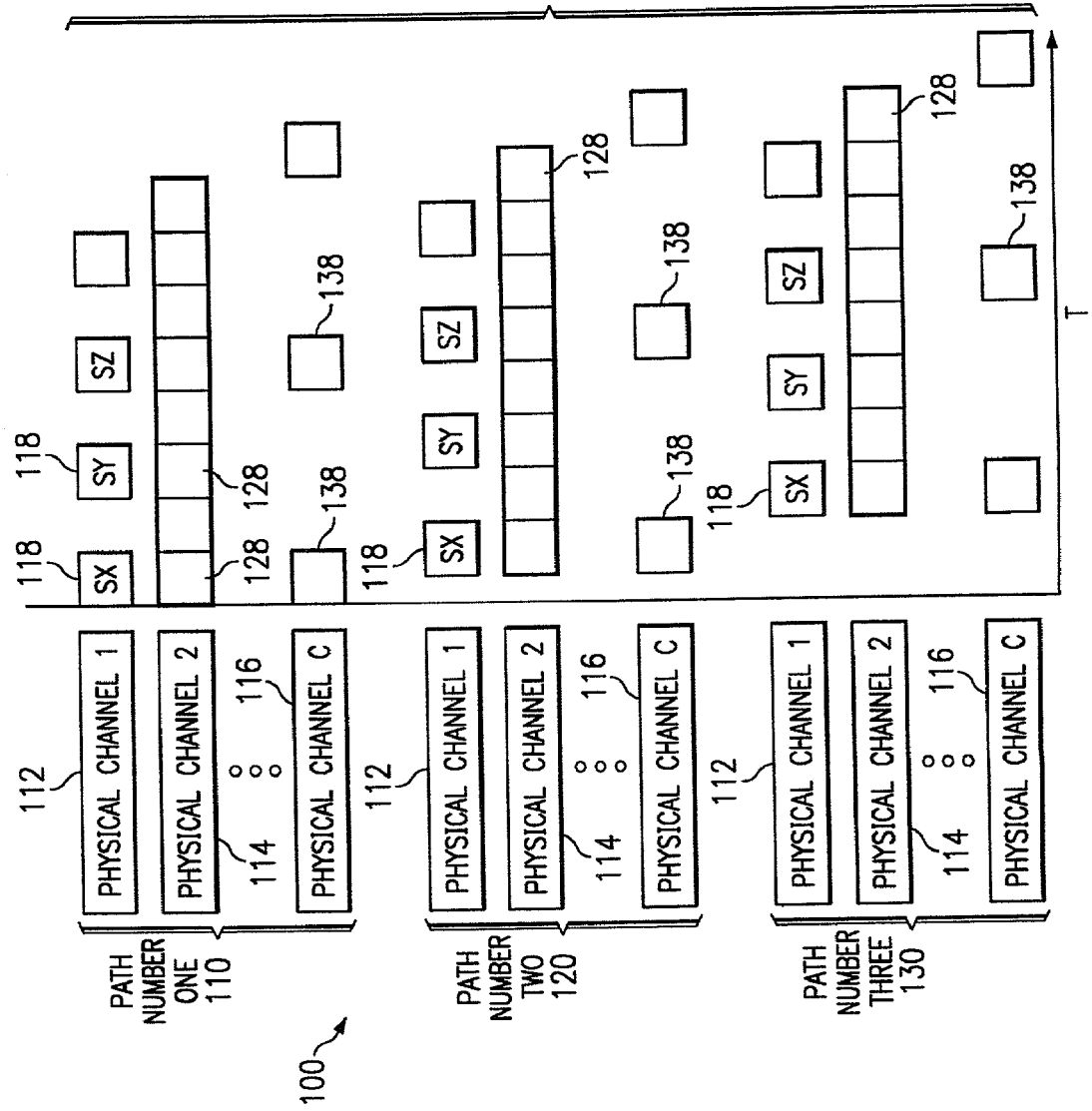

BUFFER-LESS DE-SKEWING FOR SYMBOL COMBINATION IN A CDMA DEMODULATOR

BACKGROUND OF THE INVENTION

1. Technical Field of the Invention

The present invention relates to a demodulator and, more particularly, to a demodulator for performing buffer-less de-skewing for symbol combination.

2. Description of Related Art

Wireless communication has become an essential necessity of people's everyday life. Having access to all the communication features people have been accustomed to while "on the move" has been desired. Voice communication and data communication need to be available to people through their portable devices in a cost efficient way while maintaining acceptable quality.

Code Division Multiple Access (CDMA) wireless communication is a well adopted communication standard that is used throughout the world. In a CDMA wireless communication system, a user signal is spread with a wide frequency bandwidth by the use of an individual code and is transmitted in a common frequency band. The receiver detects a desired signal by a despreading process from the CDMA signal and the individual code.

The receiver in the CDMA wireless communication system often detects multiple signals from one or more base stations and demodulates these signals in the mobile station. As illustrated in FIG. 1, the propagation of the received signals from the base stations 12 is affected by the terrain (14 and 16) and may occur over multiple paths. These multiple path signals received from the same originating transmitted signal are referred to as multipath propagation signals.

This phenomenon of multipath propagation is due to various terrain factors such as scattering, refraction and reflection. Each multipath propagation signal requires a different amount of time to reach the receiver (mobile station 10). For example, a signal 18(1) received directly from a transmitter "line of sight" will be received before the reflected propagation signal 18(2). Nonetheless, each of the multipath propagation signals 18(1) and 18(2) is utilized by the receiver to provide a better signal quality by combining the multipath propagation signals together to form a stronger signal. Because the received multipath propagation signals are shifted in time with respect to each other, a de-skewing operation is necessary to align the signals and enable the signal combination.

FIG. 2 illustrates a conventional demodulator 50 in a CDMA wireless communication system. Signals are received on different physical channels (22, 24, and 26). The signals from each channel, however, propagate through different propagation paths (for example, path #1 (20), path #2 (30), and path #3 (40)). Symbols 28, 38, and 48 within each of the received signal channels 22, 24, and 26, respectively, are de-rotated and placed in a buffer/memory 54. Thus, the symbols from each physical channel and from each propagation path are stored in the buffer 54. The symbols 28 from a first channel 22 are received from propagation path 20 and are stored in the buffer 54 at location 56. The symbols 28 from the same first channel 22 received from the propagation path 30 are stored in the buffer 54 at location 58. The symbols 28 from the first channel 22 are received from propagation path 40 and are stored in the buffer 54 at location 60. Although only three paths are shown, it will be understood that the receiver is capable of handling more or fewer paths per physical channel.

The same operation is performed for a second channel 24 for all the propagation paths, i.e., propagation paths 20, 30, and 40, with the symbols 38 for the second channel 24 stored in the buffer 54 at locations 62, 64, and 66. The same operation is also performed for the rest of the channels, i.e., channel (C) 26, for all the propagation paths, i.e., propagation paths 20, 30, and 40, with the symbols 48 for that channel (C) 26 stored in the buffer 54 at different locations. Thus, each symbol received on each physical channel from each propagation path is stored in a distinct buffer location.

This buffering process allows the demodulator 50 to wait for the symbols (28, 38, and 48) to be received from each path before processing the symbols. De-skewing is automatically performed when the last symbol of a propagation path is aligned in the buffer 54. The symbols of a physical channel received from different propagation paths are then added using an adder 74 and output to one of the accumulators (76, 78, 80) associated with that physical channel.

The process for waiting for the symbols from all the propagation paths of the physical channel to be received before combining these symbols produces a delay in the demodulator output. The delay required to perform the symbol combination is at least the maximum path delay of the received signals. Moreover, storing the received symbols in a buffer before the symbol combination increases the power consumption of the demodulator. In view of the foregoing, there is a need for a demodulator that decreases the delay and reduces the power consumption of the demodulator.

SUMMARY OF THE INVENTION

The present invention describes a demodulator in a wireless communication network for combining symbols without the need to store the received symbols in buffers for subsequent retrieval and accumulation. The demodulator according to the teachings of the present invention includes a plurality of accumulators capable of accumulating received symbols and a multiplexer for routing each received symbol to one of the accumulators based on the physical channel of the received symbol and a value of an indicator associated with the propagation path of the received symbol.

In an embodiment of the present invention, the demodulator includes a logic circuit for determining a physical channel and a propagation path of each received symbol. When the first symbol from the first propagation path of a first channel is received, a first indicator associated with the propagation path of the received symbol is incremented and a counter having a tag identifier equal to the value within the first indicator is reset. The symbol is routed by a multiplexer to one of a plurality of accumulators identified by the value of the first indicator and physical channel of the received symbol. However, when a symbol is received that is not the first symbol from the first propagation path of the first channel, then the path delay of the symbol is determined and compared to the values within a plurality of counters. The identification tag of a matching counter is loaded into an indicator associated with the propagation path of the received symbol. The received symbol is then routed by the multiplexer to the accumulator identified by the value of the indicator associated with the propagation path of the received symbol and physical channel of the received symbol. The symbol is then accumulated to that accumulator.

Thereby, each received symbol may be immediately accumulating to the accumulators containing previously accumulated received symbols from different propagation paths. This enables the system to reduce the power consumption since buffers are not utilized in the demodulator.

BRIEF DESCRIPTION OF THE DRAWINGS

A more complete understanding of the method and apparatus of the present invention may be acquired by reference to the following Detailed Description when taken in conjunction with the accompanying Drawings wherein:

FIGS. 3A and 3B illustrate a block diagram of a demodulator according to the teachings of the present invention;

DETAILED DESCRIPTION OF THE DRAWINGS

The numerous innovative teachings of the present application will be described with particular reference to the exemplary embodiments. However, it should be understood that the exemplary embodiments provide only a few examples of the many advantageous uses of the innovative teachings herein.

Figure 1:
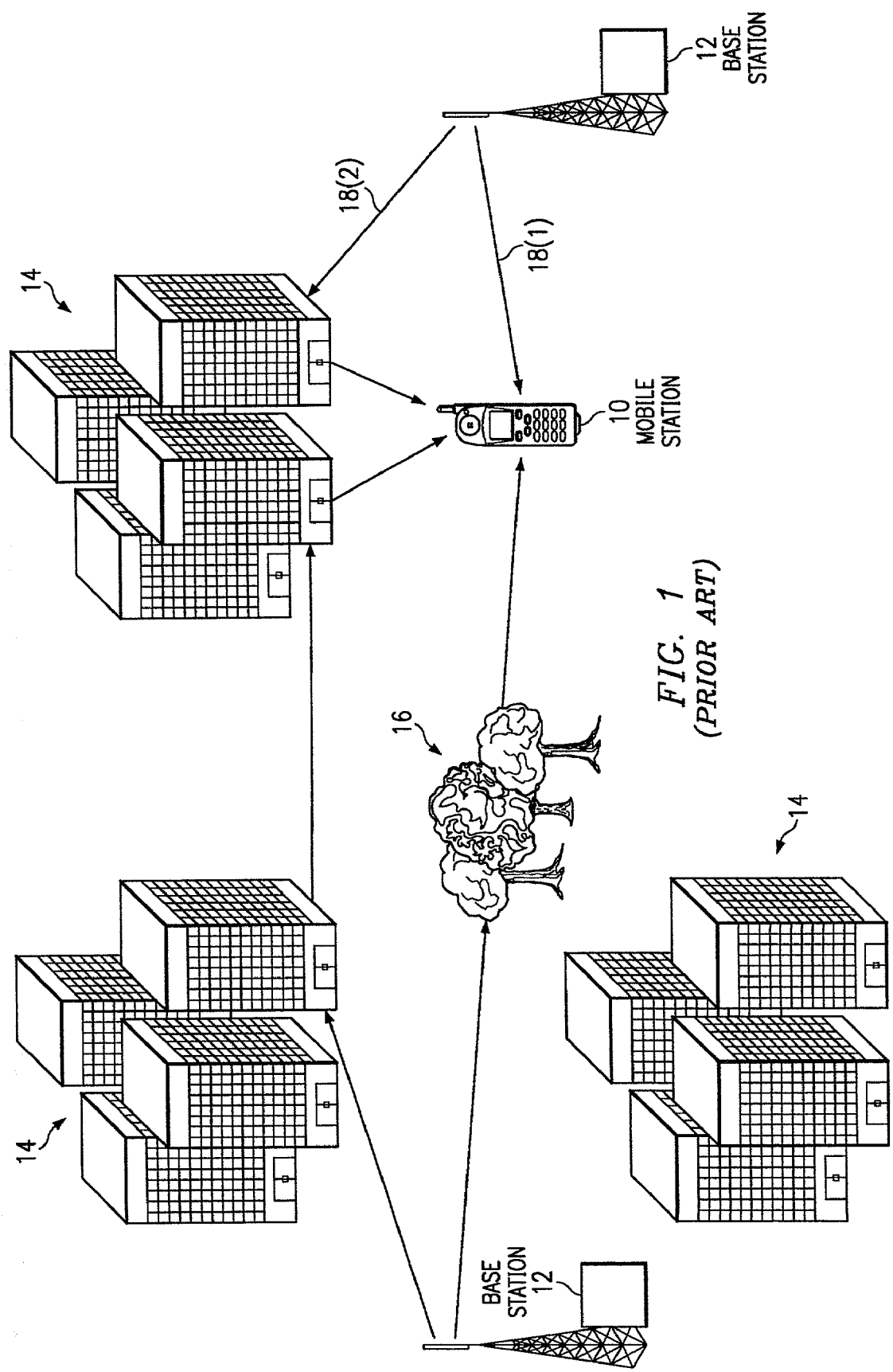
FIG. 1 (previously described) illustrates multipath propagation of signals in a wireless communication network.
Figure 2:
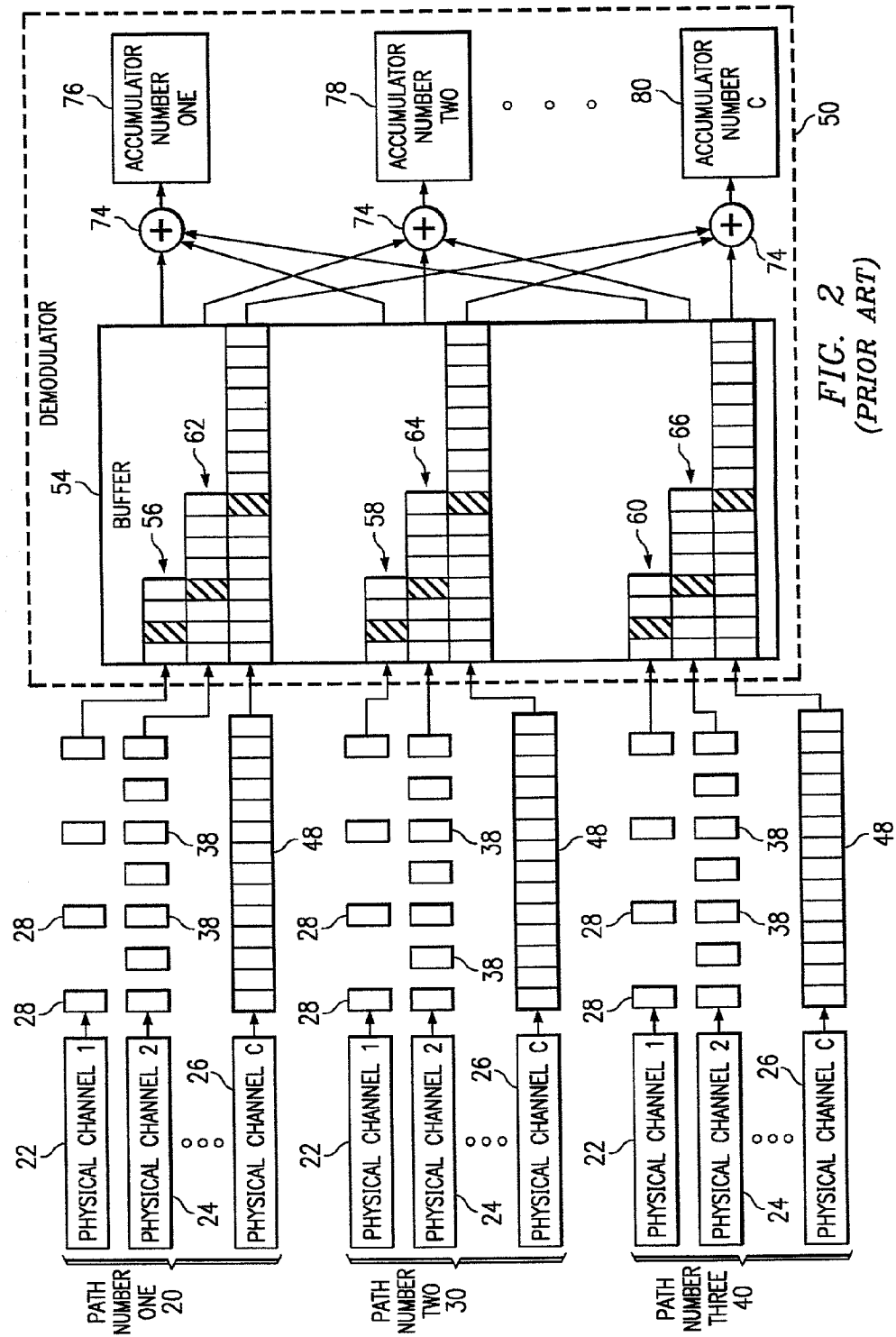
FIG. 2 previously described) illustrates a block diagram of a conventional demodulator utilizing a buffer in the combination process.
Figure 3B:
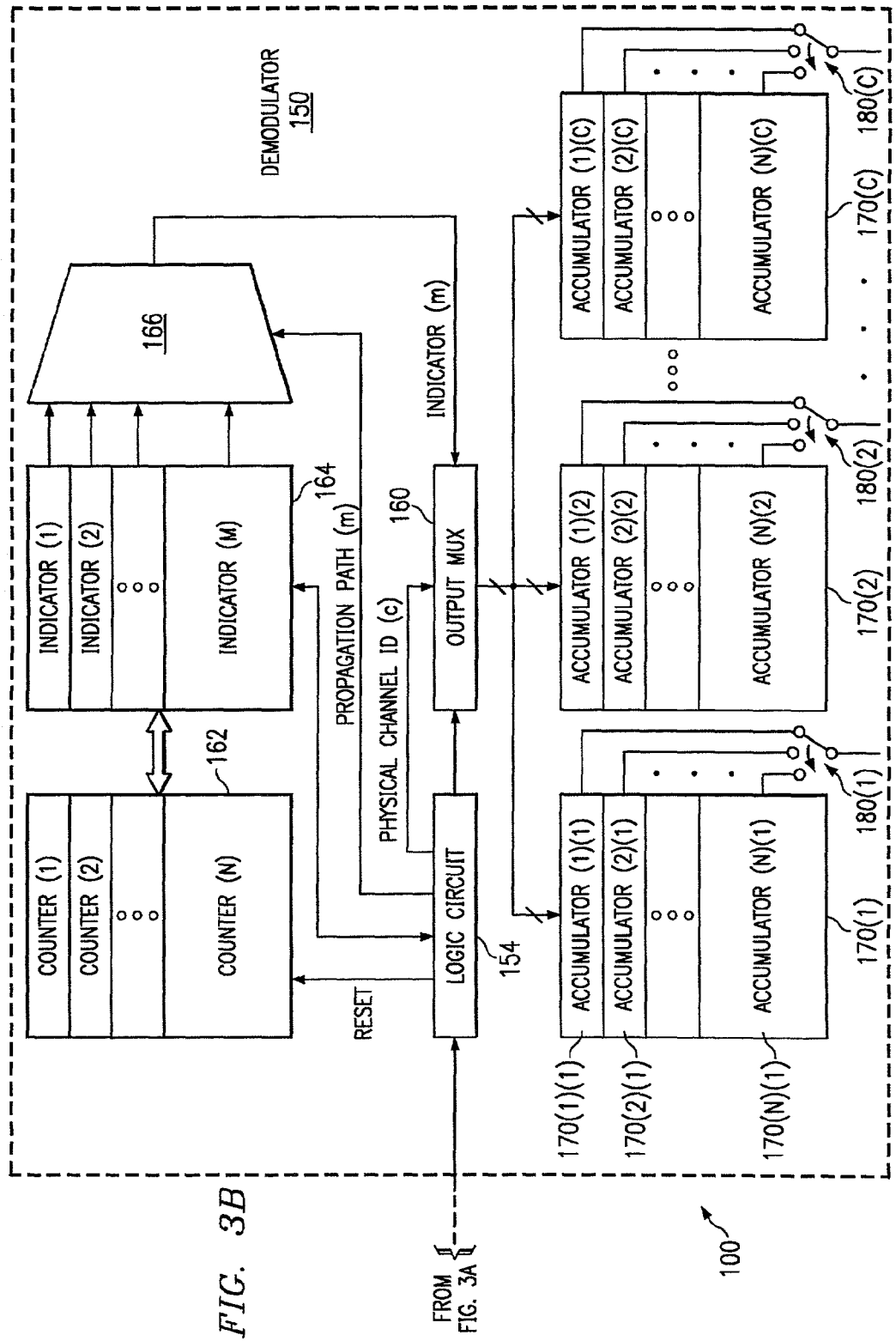

The present invention permits the combination of symbols without the need to store the received symbols in buffers for subsequent retrieval and accumulation. This allows for an immediate accumulating of a received symbol to previously received symbols from different propagation paths. Referring to FIGS. 3A and 3B, there is illustrated a block diagram for a system 100 including a demodulator 150 for performing symbol combination according to the teaching of an exemplary embodiment of the present invention. The demodulator 150 may be implemented as an integrated circuit chip or as part of the integrated circuit chip. The integrated circuit chip may be included in a mobile phone or other electronic device. The demodulator may alternatively be implemented in whole or in part using software.

The system 100 receives signals over the air interface on different physical channels (e.g., 112, 114, and 116). Signals of one physical channel may be received from a plurality of propagation paths (e.g., 110, 120, and 130). Thus, the same signal may be received a number of times depending on how many propagation paths are formed. The signals contain symbols (118, 128, and 138) therein that are received by the demodulator 150 from each of the physical channels over different propagation paths. Each physical channel has its own spreading factor which determines the rate of the symbols (118, 128, and 138) within that channel. For example, as shown in FIG. 3, the symbols 118 of channel 1 (112) are half the rate of the symbols 128 of channel 2 (114) and double the rate of the symbols 138 of channel C (116).

The demodulator 150 includes a logic circuit 154, an output multiplexer (MUX) 160, counters 162, a plurality of indicators 164, an indicator selector 166, and a plurality of accumulator sets 170.

The logic circuit 154 receives the symbols (118, 128, and 138) from different propagation paths (110, 120, and 130) and different physical channels (112, 114, 116). The logic circuit 154 functions to process the received symbols and identify the physical channel (c) and the propagation path (m) of each received symbol. The propagation path (m) is determined based on the order of occurrence of the received symbol. For example, the shortest propagation path of a received symbol (on a given channel) is the first propagation path (m=1) and the longest propagation path of the same received symbol (on the same channel) is the Mth propagation path (m=M). The physical channel (c) is determined based on the symbol being received over which channel. For example, symbol 118 is received over the first channel (c=1).

The logic circuit 154 is coupled to the counters and is configured to selectively reset a selected one of the counters. The logic circuit 154 is also coupled to the indicators 164 and is configured to selectively increment one of the indicators. The logic circuit 154 provides the determined propagation path (m) to the indicator selector 166 in order to select the indicator associated with the provided propagation path (m) (for example, if m=2, then indicator (2) is selected). The logic circuit 154 is configured to provides the determined physical channel (c), to the output multiplexer 160, to aid in routing the received symbol.

The output multiplexer 160 is coupled to the logic circuit 154 and is configured to receive the symbols (118, 128, and 138) from the logic circuit 154 and route each one of the received symbols to an appropriate accumulator $170(n)(c)$ based on a value of two control input signals. The first control input signal contains the physical channel identification (c) that is received from the logic circuit 154. The second control input signal contains a value (n) that is provided by the indicator selector 166 chosen one of the indicators 164 associated with the propagation path (m) of the received symbol.

The plurality of indicators 164 include M indicators, where each one of the indicators 164 corresponds to a propagation path. The plurality of indicators are coupled to the logic circuit 154. The first indicator is configured to be selectively incremented upon the determination by the logic circuit 154 that the received symbol is from a first propagation path (m=1) of a first physical channel (c=1). The indicators 164 are coupled to the counters 162 and are configured to be loaded with a value equal to the identification tag of a counter containing a value equal to the path delay of the received symbol. The value (n) of the indicator associated with the first propagation path (m=1) indicator (1), is used to determine which one of the counters is reset upon the receipt of a symbol from the first propagation path (m=1) of the first physical channel (c=1). The determination may be performed by the logic circuit 154 using the interface between the indicators 164 and the logic circuit 154. Alternatively, the determination may be performed directly by an interface between the indicators 164 and the counters 162.

The selection of the indicator from the plurality of indicators 164 is performed by the indicator selector 166 that is coupled to the indicators 164. The indicator selector 166 receives as input the propagation path (m) from the logic circuit 154 and outputs the value (n) contained in the indicator associated with the propagation path (m) (i.e., indicator (m)).

The demodulator 150 includes the counters 162 which are coupled to the logic circuit 162 and the indicators 164. A selected one of the counters 162, having an identification tag equal to the value (n) within an indicator associated with the first propagation path (indicator(1)) is reset upon the receipt of the first symbol 118 from a first propagation path 110 of a first channel 112. The counters are generally configured to automatically increment their value by one for each chip period. The number of counters (N) utilized may be equal to the number of accumulators (N) needed or utilized by each physical channel (c). The counters 162 are configured to update the value (n) of a selected one of the indicators 164, as will be described hereinafter, and thus control, through the selected value (n), and the physical channel identification (c), the accumulator 170(n)(c) to which a symbol is routed by the multiplexer 160.

The demodulator 150 also includes a plurality of accumulator sets 170(c), each accumulator set 170(c) is associated with a physical channel (c). Each accumulator set 170(1), 170(2), and 170(C) contains therein a number of accumulators (N). The N accumulators within a particular accumulator set, 170(c), are addressed by the output multiplexer 160 using the value (n) of the second control input signal received from the indicator selector 166 and the physical channel identification (c) received from the logic circuit 154. Thus, a value (n) of one of the indicators 164 is used along with the physical channel identification (c) to route a received symbol to the accumulator 170(n)(c).

Upon completion of the symbol combination process of an accumulator within an accumulator set 170(c), each combined symbol is provided to another component (not shown) external or internal to the demodulator through switches 180 in order to perform other functions on the provided combined symbol. For example, once the first symbol of the first channel 112 is accumulated from all the propagation paths (paths 110, 120, and 130) to a first accumulator of the first channel, accumulator 170(1)(1), the switch 180(1) is configured to switch in such a way output the value within the accumulator 170(1)(1). The value within the accumulator 170(1)(1) is provided to the external/internal circuit that may perform other functions. It should be understood that once the accumulator provides the value to the external/internal circuit, the value contained within the accumulator is not needed and may be discarded.

It should be understood that the first received symbol or sub-symbol from the first propagation path of a channel is accumulated to an empty accumulator. However, if the accumulator has information therein, the symbol is loaded onto the accumulator and the previous value within the accumulator is overwritten.

The number of accumulators (N) in an accumulator set 170 may be determined during the design phase and may be preset prior to the operation of the demodulator 150. Thus, during the design stage a predetermined number of accumulators (N) are defined for each physical channel based on several factors, such as models, quality of service desired, etc. For example, the number of accumulators (N) within an accumulator set 170 in the demodulator 150 is determined by the following equations:

$$f(Z) = t_{max\_delay} + t_{symbol} - (Z \cdot t_{symbol} + t_{operand}), \text{ and}$$

$$N = 1 + \max_Z \left( \arg_{f(Z)>0} (f(Z)) \right)$$

where $t_{max\_delay}$ is the maximum propagation path delay of the received symbols, $t_{symbol}$ is the symbol duration of the symbols, $t_{operand}$ is the time required for generation of the symbol (or sub-symbol as described hereinbelow), i.e., integration time, Z is an integer, and N is the number of accumulators per physical channel, i.e., the number of accumulators within an accumulator set 170. It should also be understood that more accumulators within the accumulator set 170 in the demodulator 150 will guarantee a higher quality of service resulting from more symbols being combined.

The demodulator 150 may receive different symbols that are received overlapping and should not accumulate these different symbols to the same accumulator. Thus, the overlapping different symbols need to be accumulated to different accumulators. This may be activated by using the demodulator 150 of FIGS. 3A and 3B and deploying the method described hereinafter.

Figure 4:
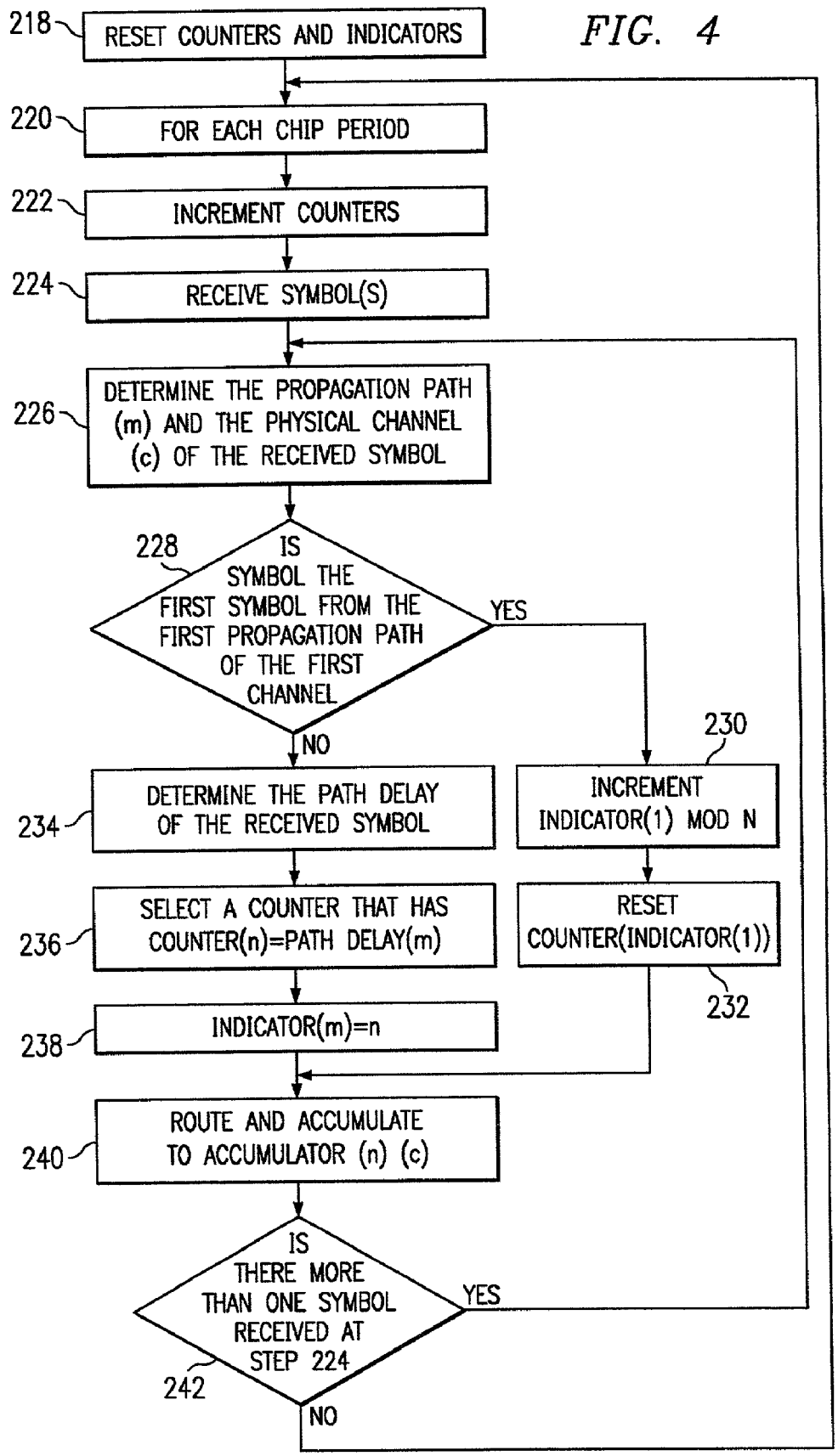
FIG. 4 is a flow diagram illustrating an exemplary embodiment of the operation of the demodulator of FIGS. 3A and 3B.

Referring now to FIG. 4, there is illustrated a flow diagram of an exemplary embodiment of the operation of the demodulator of FIGS. 3A and 3B. The counters 162 and the indicators 164 are first reset (step 218). The counters 162 are generally incremented by one (step 222) each chip period (step 220). The demodulator 150 may receive a symbol or symbols at step 224. For each one of the received symbols, a determination is made, by the logic circuit 154, identifying the physical channel (c) and the propagation path (m) of the received symbol (step 226). For simplicity, only one channel (c=1) will be described hereinbelow, however, it should be understood that more channels may be used and the same operation will be performed for each channel.

The received symbol is examined by the logic circuit 154 and if a determination is made that the symbol is a first received symbol from a first propagation path (m=1) (step 228) of a first channel (c=1), then the indicator having an identification tag (i.e., indicator(identification tag)) associated with the first propagation path (m=1), i.e., indicator (1), has a value that is incremented (modulo N)+1, i.e., from 1 to N (step 230), where N is the number of accumulators within an accumulator set 170(c). It should be understood that the first received symbol discussed herein is the first occurrence of a new symbol on a first propagation path of a first channel. The counter having an identification tag (i.e., counter (identification tag)) equal to the value of the incremented first indicator, i.e., indicator (1), is reset (step 232). The first received symbol is then routed and accumulated to an accumulator identified by the value of the indicator associated with the first propagation path (m=1), and the physical channel identification (c) of the received symbol (step 240). Thus, the received symbol is accumulated to a first accumulator 170(1)(c).

If the symbol at step 228 is determined by the logic circuit 154 not to be the first received symbol from the first propagation path (m=1) of the first channel (c=1), then the path delay of the received symbol is determined (step 234). The path delay of the received symbol is the time difference, in chips, between the receipt of the first symbol from the first propagation path (m=1) of the first channel (c=1) and the current received symbol. A comparison is the made to the counters 162, and the counter (n) having a value therein that matches the determined path delay of the received symbol is then selected(step 236). The identification tag (n) of the selected counter 162 that matches (counter (n)) is then loaded into the indicator associated with the propagation path (m) of the received symbol (indicator (m)) (step 238). For example, if a symbol is received from the third propagation path (m=3) and the path delay of the symbol is 10 chips and the third counter (counter (3)) has a value of 10 therein, then the indicator associated with the propagation path (m=3) of the symbol (indicator (3)) is loaded with a value of 3. The received symbol is then routed and accumulated to the accumulator identified by the value of the indicator associated with the propagation path (m) and the physical channel (c), for example, accumulator 170(3)(c) (step 240).

If at step 224, a plurality of symbols are received simultaneously, then steps 226–240 are repeated (step 242) for each of the other symbols during the same chip period. It should be understood, that the symbol combination process described hereinabove may be implemented for symbols or sub-symbols.

For simplicity, the process for symbols received from only one channel (c=1) was described in the method hereinabove, however, it should be understood that more channels may be used. For example, if a symbol is received at step 224 and a determination at step 226 is made that the received symbol is the first symbol from the first propagation path (m=1) of the second channel (c=2). The symbol is determined not to be the first symbol from the first propagation path of the first channel at step 228 and the path delay of the symbol is determined. The path delay in this case is the time difference, in chips, between the receipt of the first symbol from the first propagation path of the first channel and the currently received symbol which is the first symbol from the first propagation path but of the second channel. One of the N counters (counter (n)) is selected based on a match between the determined path delay of the symbol and the counter value. The identification tag of the counter (n) is loaded into the indicator associated with the propagation path (m=1) of the received symbol, indicator(1). Thus indicator (1) now contains the value (n). The received symbol is then routed and accumulated to the accumulator identified by the value (n) within the indicator associated with the propagation path (m=1) of the received symbol and the physical channel (c=2) of the received symbol. Thus, the received symbol is routed and accumulated to accumulator (n)(c), i.e., accumulator (1)(2).

It should be understood that the same operation described hereinabove may be applied to all the received symbols from different propagation paths over different channels.

Figure 5A:
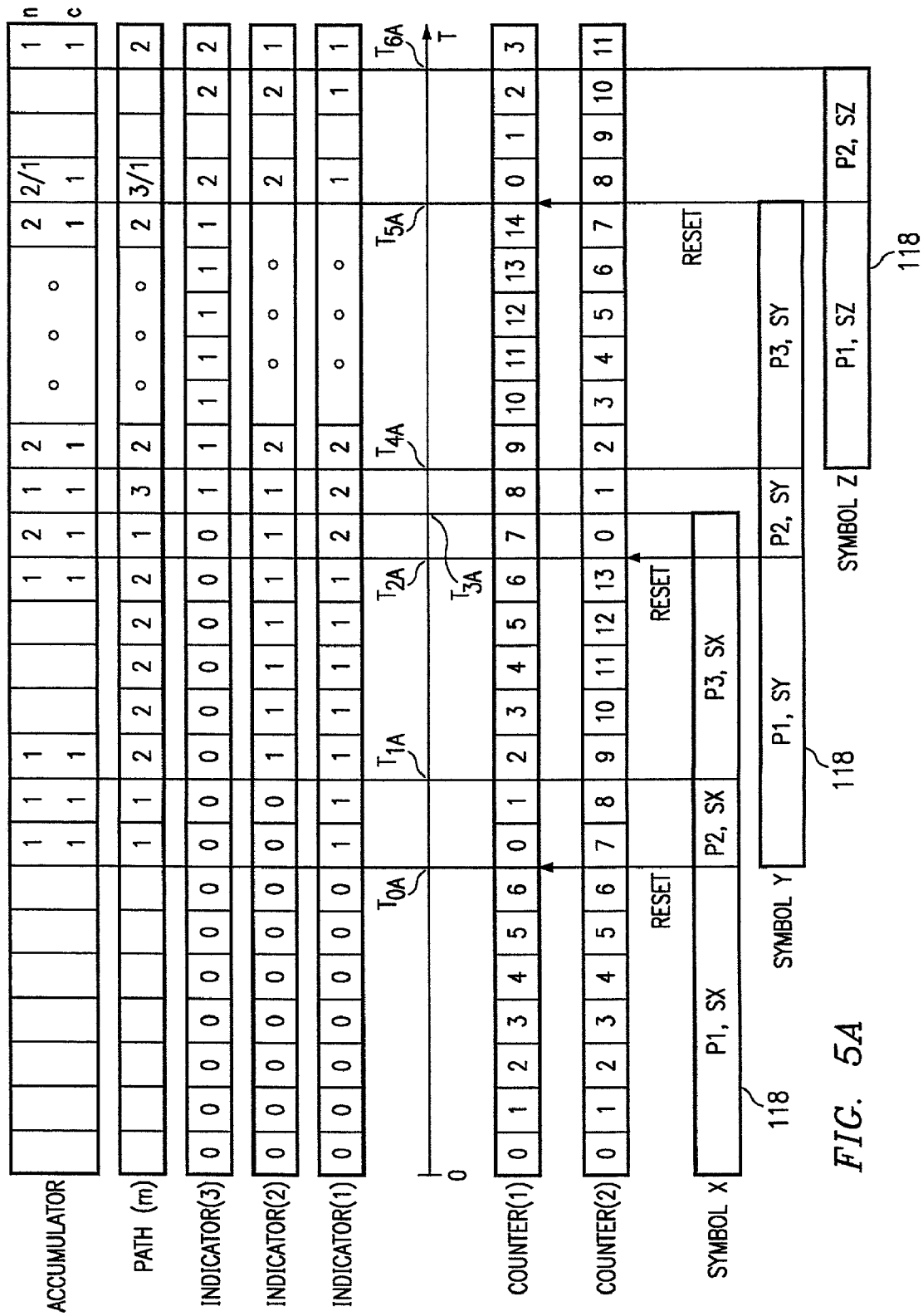
FIGS. 5A and 5B illustrate timing diagrams for the operation of the demodulator of FIGS. 3A and 3B for the receipt of symbols from multipath propagation signals.
Figure 5B:
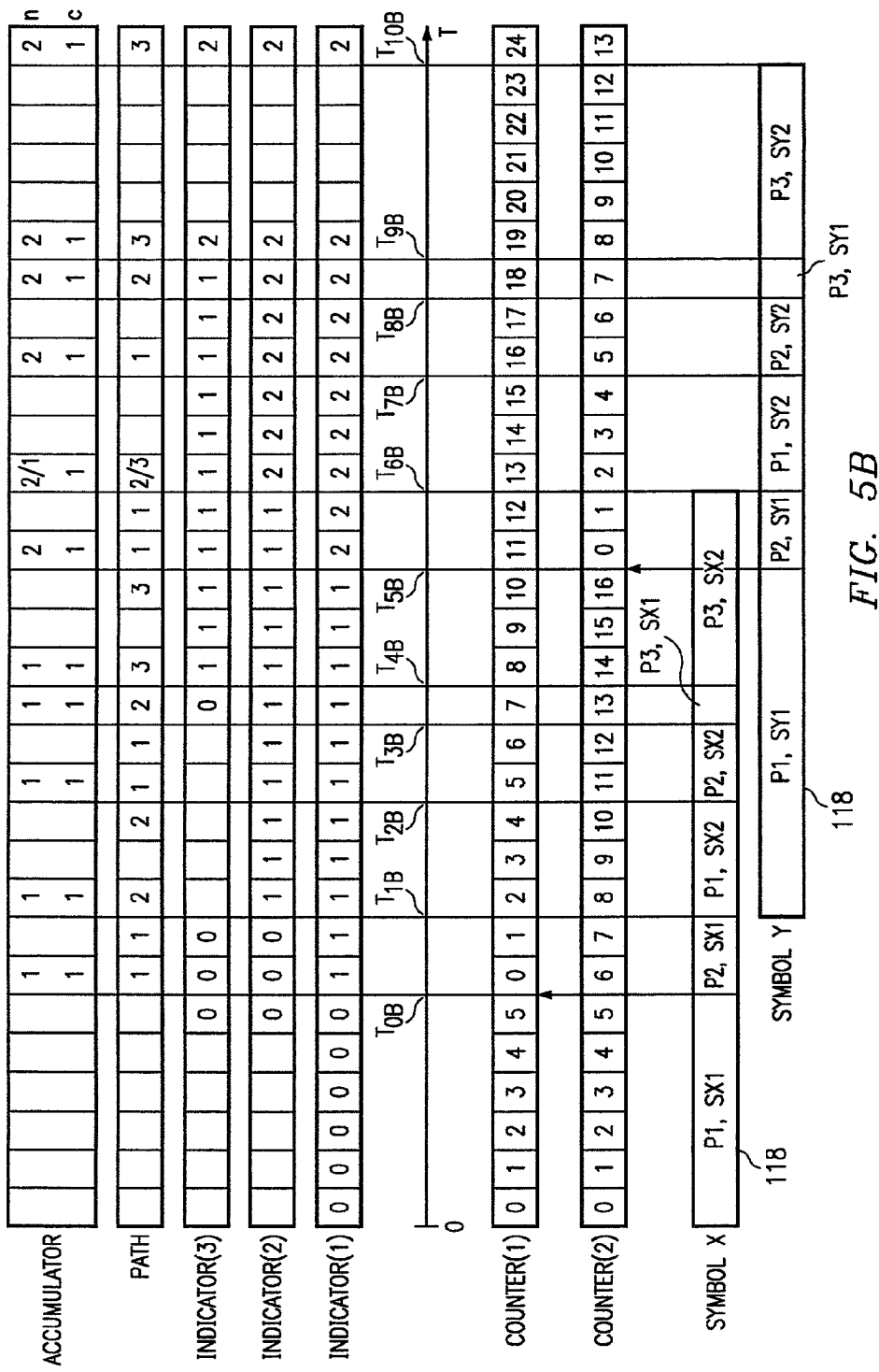

FIGS. 5A and 5B illustrate two examples of the operation of the demodulator of FIGS. 3A and 3B according to an exemplary embodiment of the present invention. Symbols are generated by integrating the received signal over a certain number of chips (spreading factor) as understood by a person skilled in the art. In the example of FIG. 5A symbols are used whereas in the example of FIG. 5B sub-symbols are used which are the integration of the signal over a shorter length than the spreading factor, in this case half the spreading factor. Consequently, two sub-symbols in FIG. 5B are equivalent to one symbol in FIG. 5A. In the following examples it is assumed, for simplicity reasons, that all the received symbols are associated with the first channel (c=1). It should however be understood that this process may be applied to more than one channel.

Referring now to FIG. 5A, there is illustrated a timing diagram of an example of the operation of the demodulator of FIGS. 3A and 3B. Symbols 118 are received by the demodulator 150 from multiple propagation paths formed by each symbol. For example, symbol x may be received from three propagation paths, (path #1, path #2, and path #3). The symbols illustrated in FIG. 5A are labeled by the propagation path and the symbol number. For example, symbol p1,sx is the symbol associated with the first propagation path (m=1) and the first symbol (symbol x).

The counters are incremented by one each chip period. A first symbol (symbol x) from the first propagation path (p1,sx) is received (step 224) at time instant $t_{0A}$. The symbol is determined, by the logic circuit 154, to be the first symbol from the first propagation path (m=1) and the first physical channel (c=1) (step 226). Since the symbol (p1,sx) is the first occurrence of symbol x from the first propagation path (m=1) of the first channel (step 228), the indicator associated with the propagation path (m=1) of the received symbol (p1,sx) (indicator (1)) is incremented to a value of 1 (step 230) and a counter having an identification tag equal to the value of the incremented indicator (1), i.e., counter (1), is reset (step 232). It should be understood that the other counters are not affected and retain their values. The symbol (p1,sx) is then routed to the accumulator identified by the physical channel (c=1) of the received symbol and the value (i.e., n=1) of the indicator associated with the propagation path (m=1) of the symbol, i.e., indicator(1). Thus, the symbol (p1,sx) is routed and accumulated (step 240) to the accumulator 170(n)(c), i.e., accumulator 170(1)(1).

The same symbol x is then received from the second propagation path (p2,sx) (step 224) at time instant $t_{1A}$ (two chips later than $t_{0A}$). The symbol is determined to be from the second propagation path (m=2) and the first physical channel (c=1) by the logic circuit 154 (step 226). Since the received symbol is not received from the first propagation path (m=1) of the first physical channel (c=1), then the path delay of the symbol (p2,sx) is determined, i.e., 2 chips. The path delay being the time, in chips, between the first occurrence of the first symbol on the first propagation path (p1, sx) of the first channel (at time $t_{0A}$) and the symbol (p2, sx) (at time $t_{1A}$). As described hereinabove, the counters automatically increment each chip period, thus counter (1) would have a value of 2 and counter (2) would have a value of 9, thus, the counter that contains a value that matches the path delay (in this case, the path delay is 2) is selected. Since the symbol (p2,sx) is associated with the second propagation path (m=2), the indicator associated with the propagation path (m=2) (indicator (2)) is loaded with a value equal to the identification tag of the matching/selected counter, i.e., 1, and the symbol is routed to the accumulator identified by the value of the indicator associated with the propagation path (m=2) (indicators (2)=1) and the physical channel (c=1) of the received symbol. In this case, the symbol is routed and accumulated to accumulator 170(1)(1).

At time instant $t_{2A}$ (seven chips later than $t_{0A}$) a first occurrence of a second symbol (symbol y) from a first propagation path (p1,sy) is received. The symbol is determined to be from the first propagation path (m=1) and the first physical channel (c=1) (step 226). Since the received symbol (p1, sy) is the first occurrence of the second symbol from the first propagation path (m=1) of the first channel (c=1), the indicator associated with the propagation path (m=1) of the received symbol (indicator (1)) having a value of 1 is incremented to a value of 2 and a counter having an identification tag equal to the value within the updated indicator (1), i.e., counter (2), is reset. It should be understood that counter (1) still contains a value of seven. The second symbol from the first propagation path (p1,sy) is then routed to the accumulator identified by the value (n=2) within the indicator associated with the propagation path (m=1) of the symbol, i.e., indicator (1), and the physical channel (c=1) of the received symbol. Thus, the symbol (p1,sy) is routed and accumulated to accumulator 170(2)(1).

At time instant $t_{3A}$ (8 chips later than $t_{0A}$), the first symbol (symbol x) from a third propagation path (p3,sx) is received. The path delay of the symbol (p3,sx) is determined, i.e., 8 chips. The determined path delay is compared to the counters (i.e., counter (1) and counter (2)), and a determination is made that counter (1) matches the path delay (i.e.

8) since counter (1) has a value of 8 whereas counter (2) has a value of 1. The tag identification of the matching counter (i.e., 1) is loaded into the indicator (indicator (3)) identified by the third propagation path (m=3). The received symbol (p3,sx) is then routed and accumulated to the accumulator identified by the physical channel (c=1) of the received symbol and the value (n=1) within the indicator associated with the propagation path (m=3) of the received symbol, accumulator(n)(c), i.e., accumulator 170(1)(1).

Upon receipt of the second symbol (symbol) from the second propagation path (p2,sy) at time instant $t_{4A}$ (2 chips later than $t_{2A}$ and 9 chips later than $t_{0A}$), the path delay of that symbol is determined (i.e., 2 chips), and is compared to the value of the counters. In this case, counter (1) has a value of 9 and counter (2) has a value of 2, thus, counter (2) which matches the determined path delay is selected. The identification tag of the matching counter (i.e., 2) is loaded into the indicator identified by the second propagation path (m=2) (indicator (2). The symbol (p2,sy) is then routed and accumulated to the accumulator identified by the physical channel (c=1) and the value (n=2) of the indicator associated with the propagation path (m=2) of the received symbol, accumulator(n)(c), i.e., accumulator 170(2)(1).

At time instant $t_{5A}$, two symbols (p3,sy) and (p1,sz) are received simultaneously. Either one of the two symbols may be processed first. For the received symbol (symbol y) from the third propagation path (p3,sy), the path delay, i.e., the time, in chips, between the first occurrence of symbol y on the first propagation path (p1,sy) of the first channel (at time $t_{2A}$) and symbol (p3,sy) (at time $t_{5A}$), is determined, i.e., 8 chips. The determined path delay is compared to the counters (i.e., counter (1) and counter (2)), and a determination is made that counter (2) matches the path delay value since counter (2) has a value of 8. The identification tag of the matching counter (i.e., 2) is loaded into an indicator identified by the third propagation path (m=3) (indicator (3)). The received symbol (p3,sy) is then routed and accumulated to the accumulator identified by the value (n=2) of the indicator associated with the third propagation path (indicator (3)) and the physical channel (c=1) of the received symbol, accumulator(n)(c), i.e., accumulator 170(2)(1).

The symbol (symbol z) from the first propagation path (p1,sz) is received at the same time instant $t_{5A}$ symbol (p3, sy) was received. Since symbol (p1,sz) is determined by the logic circuit 154 to be the first occurrence of symbol z from the first propagation path (m=1) of the first channel (c=1), the indicator associated with the propagation path (m=1) of the received symbol (indicator (1)) is incremented to a value of 1 and a counter having an identification tag equal to the value (n=1) of the updated indicator, i.e., counter (1), is reset. It should be understood that the first indicator (indicator (1)) is incremented in such a way as to only contain a value from 1 to N. Thus, when the value within indicator (1) is N, then upon the next incrementing step, the value will be 1. The symbol (p1,sz) is then routed to the accumulator identified by the physical channel (c) of the received symbol and the value (n=1) of the indicator associated with the propagation path (m=1) of the received symbol, indicator (1). Thus, the symbol (p1,sz) is routed and accumulated to the accumulator(n)(c), i.e., first accumulator 170(1)(1).

At time instant $t_{6A}$ (3 chips later than $t_{5A}$), the third symbol (symbol z) from the second propagation path (m=2) (p2,sz) is received. The path delay of the symbol (p2,sz) is determined, i.e., 3 chips. The determined path delay is compared to the counters (i.e., counter (1) and counter (2)), and a determination is made that counter (1) matches the path delay since counter (1) has a value of 3 whereas counter (2) has a value of 11. The identification tag of the matching counter (i.e., 1) is loaded into an indicator identified by the second propagation path (m=2) (indicator (2)). The received symbol (p3,sz) is then routed and accumulated to the accumulator identified by the physical channel (c=1) of the received symbol and the value (n=1) of the indicator associated with the propagation path (m=2) of the received symbol, accumulator(n)(c), i.e., accumulator 170(1)(1).

Illustrated hereinabove is the receipt of the first three symbols (symbol x, y and z) for one channel. Symbols x and y are received from three propagation paths, whereas symbol z is only received from two propagation paths. However, it should be understood that more or fewer paths may be utilized in the receipt of each symbol. It should be also understood that other symbols may be received and will be processed by the demodulator 150 in the same manner as described hereinabove.

Referring now to FIG. 5B, there is illustrated a timing diagram of another example of the operation of the demodulator of FIGS. 3A and 3B. The example described hereinafter is substantially similar to the example of FIB. 5A but for sub-symbols instead of symbols. Each symbol contains two parts or sub-symbols which are labeled accordingly. For example, symbol x contains sub-symbol sx1 and sx2.

A first sub-symbol, of symbol x, from a first propagation path (m=1) (p1,sx1) is received at time instant $t_{0B}$. The symbol is determined to be the first sub-symbol, relating to symbol x, from the first propagation path (m=1) and the first physical channel (c=1) by the logic circuit 154 (step 226). Since the sub-symbol (p1,sx1) is the first receipt of a sub-symbol relating to symbol x from the first propagation path (m=1) of the first physical channel (step 228), the indicator associated with the propagation path (m=1) of the received sub-symbol (p1,sx1) (indicator (1)) is incremented to a value of 1 (step 230) and a counter having an identification tag equal to the value (n=1) of the incremented indicator (indicator (1)), i.e., counter (1), is reset (step 232). The sub-symbol (p1,sx1) is then routed and accumulated to the accumulator identified by the physical channel (c=1) of the received sub-symbol and the value of the indicator associated with the propagation path (m=1) of the received sub-symbol, indicator (1). Thus, the sub-symbol (p1,sx1) is routed and accumulated (step 240) to the accumulator 170 (n)(c), i.e., accumulator 170(1)(1).

The same sub-symbol, of symbol x, from the second propagation path (p2,sx1) is then received at time instant $t_{1B}$ (two chips later than $t_{0B}$). The sub-symbol is determined to be from the second propagation path (m=2) and the first physical channel (c=1) by the logic circuit 154 (step 226). Since the received sub-symbol is not received from the first propagation path (m=1) of the first physical channel (c=1), then the path delay of the sub-symbol (p2,sx1) is determined. The path delay being the time, in chips, between the first occurrence of the first sub-symbol relating to a symbol on the first propagation path (p1,sx1) (at time $t_{0B}$) and the sub-symbol (p2,sx1) (at time $t_{1B}$). The counters, as described hereinabove, automatically increment by one each chip period, thus counter (1) would have a value of 2 and counter (2) would have a value of 8, thus, the counter that contains the value that matches the path delay (in this case counter (1)) is selected. Since the sub-symbol (p2,sx1) is associated with the second propagation path (m=2), the indicator associated with the propagation path (m=2) (Indicator (2)) is loaded with a value equal to the identification tag of the matching counter, i.e., 1, and the sub-symbol is routed to the accumulator identified by the value of the indicator associated with the propagation path (m=2) (indicator (2)=1) and the physical channel (c=1) of the received sub-symbol. In this case, the sub-symbol is routed and accumulated to accumulator 170(1)(1).

The second sub-symbol, of symbol x, from the first propagation path (m=1) (p1,sx2) is then received at time instant $t_{2B}$ (5 chips later than $t_{0B}$). The sub-symbol is determined to be the second sub-symbol or the second part of symbol x from the first propagation path (m=1) and the first physical channel (c=1) by the logic circuit 154 (step 226). Since the received sub-symbol is not the first sub-symbol received from the first propagation path (m=1) of the first physical channel (c=1), then the path delay of the sub-symbol (p1,sx2) is determined (i.e., 5 chips). The counters, as described hereinabove, automatically increment by one each chip period, thus counter (1) would have a value of 5 and counter (2) would have a value of 11, thus, the counter that contains the value that matches the path delay (in this case counter (1)) is selected. Since the sub-symbol (p1,sx2) is associated with the first propagation path (m=1), the indicator associated with the propagation path (m=1) (Indicator (1)) is loaded with a value equal to the identification tag of the matching counter, i.e., 1, and the sub-symbol is routed to the accumulator identified by the value of the indicator associated with the propagation path (m=1) (indicator (1)=1) and the physical channel (c=1) of the received sub-symbol. In this case, the sub-symbol is routed and accumulated to accumulator 170(1)(1).

At time instant $t_{3B}$ (7 chips later than $t_{0B}$), the second sub-symbol, of symbol x, from the second propagation path (m=2) (p2,sx2) is received. The sub-symbol is determined to be the second sub-symbol or the second part of symbol x from the second propagation path (m=2) and the first physical channel (c=1) by the logic circuit 154 (step 226). Since the received sub-symbol is not the first sub-symbol received from the first propagation path (m=1) of the first physical channel (c=1), then the path delay of the sub-symbol (p2,sx2) is determined (i.e., 7 chips). The counters, as described hereinabove, automatically increment by one each chip period, thus counter (1) would have a value of 7 and counter (2) would have a value of 13, thus, the counter that contains the value that matches the path delay (in this case counter (1)) is selected. Since the sub-symbol (p2,sx2) is associated with the second propagation path (m=2), the indicator associated with the second propagation path (m=2) (indicator (2)) is loaded with a value equal to the identification tag of the matching counter, i.e., 1, and the sub-symbol is routed to the accumulator identified by the value of the indicator associated with the propagation path (m=2) (indicator (2)=1) and the physical channel (c=1) of the received sub-symbol. In this case, the sub-symbol is routed and accumulated to accumulator 170(1)(1).

At time instant $t_{4B}$ (8 chips later than $t_{0B}$), the first sub-symbol, of symbol x, from the third propagation path (p3,sx1) is received. The sub-symbol is determined to be the first sub-symbol or the first part of symbol x from the third propagation path (m=3) and the first physical channel (c=1) by the logic circuit 154 (step 226). Since the received sub-symbol is not the first sub-symbol received from the first propagation path (m=1) of the first physical channel (c=1), then the path delay of the sub-symbol (p3,sx1) is determined (i.e., 8 chips). The counters, as described hereinabove, automatically increment by one each chip period, thus counter (1) would have a value of 8 and counter (2) would have a value of 14, thus, the counter that contains the value that matches the path delay (in this case counter (1)) is selected. Since the sub-symbol (p3,sx1) is associated with the third propagation path (m=3), the indicator associated with the propagation path (m=3) (Indicator (3)) is loaded with a value equal to the identification tag of the matching counter, i.e., 1, and the sub-symbol is routed to the accumulator identified by the value of the indicator associated with the propagation path (m=3) (indicator (3)=1) and the physical channel (c=1) of the received sub-symbol. In this case, the sub-symbol is routed and accumulated to accumulator 170(1)(1).

A first sub-symbol, of symbol y, from the first propagation path (m=1) (p1,sy1) is received at time instant $t_{5B}$. The symbol is determined to be from the first propagation path (m=1) and the first physical channel (c=1) by the logic circuit 154 (step 226). Since the sub-symbol (p1,sx1) is the first receipt of a sub-symbol, relating to symbol y, from the first propagation path (m=1) of the first channel (step 228), the indicator associated with the propagation path (m=1) of the received sub-symbol (p1,sx1) (indicator (1)) is incremented to a value of 2 (step 230) and a counter having an identification tag equal to the value (n=2) of the incremented indicator (indicator (1)), i.e., counter (2), is reset (step 232). The sub-symbol (p1,sy1) is then routed and accumulated to the accumulator identified by the physical channel (c=1) of the received sub-symbol and the value (n=2) of the indicator associated with the propagation path (m=1) of the received sub-symbol, indicator (1). Thus, the sub-symbol (p1,sy1) is routed and accumulated (step 240) to the accumulator 170(n)(c), i.e., accumulator 170(2)(1).

At time instant $t_{6B}$ (2 chips later than $t_{5B}$ and 11 chips later than $t_{0B}$), two sub-symbols are received concurrently, a second sub-symbol, of symbol x, from a third propagation path (p3,sx2) and a first sub-symbol, of symbol y, from a second propagation path (p2,sy1). In this case, either one of the two sub-symbols may be processed first. For sub-symbol (p2,sy1), sub-symbol is not the first sub-symbol, relating to symbol y, received from the first propagation path (m=1) of the first physical channel (c=1), thus the path delay of the sub-symbol (p2,sy1) is determined, i.e., 2 chips. The path delay, in this case, being the time, in chips, between the first occurrence of the first sub-symbol relating to symbol y on the first propagation path (p1,sy1) (at time $t_{5B}$) and the sub-symbol (p2,sy1) (at time $t_{6B}$). The counters, as described hereinabove, automatically increment by one each chip period, thus counter (1) would have a value of 13 and counter (2) would have a value of 2, thus, the counter that contains the value that matches the path delay (in this case counter (2)) is selected. Since the sub-symbol (p2,sy1) is associated with the second propagation path (m=2), the indicator associated with the propagation path (m=2) (Indicator (2)) is loaded with a value equal to the identification tag of the matching counter, i.e., 2, and the sub-symbol is routed to the accumulator identified by the value of the indicator associated with the propagation path (m=2) (indicator (2)=2) and the physical channel (c=1) of the received sub-symbol. In this case, the sub-symbol is routed and accumulated to accumulator 170(n)(c), i.e., accumulator170(2)(1).

At the same chip period and while the counters are at the same values the sub-symbol (p3,sx2) is processed. This sub-symbol is determined not to be the first sub-symbol, relating to symbol x, received from the first propagation path (m=1) of the first physical channel (c=1), and thus the path delay of the sub-symbol (p3,sx2) is determined, i.e., 13 chips. The path delay, in this case, being the time, in chips, between the first occurrence of the first sub-symbol relating to symbol x on the first propagation path (p1,sx1) (at time $t_{0B}$) and the sub-symbol (p3,sx2) (at time $t_{6B}$). Counter (1) still contains a value of 13 and counter (2) contains a value of 2, thus, the counter that contains the value that matches the path delay (in this case counter (1)) is selected. Since the sub-symbol (p3,sx2) is associated with the thrid propagation path (m=3), the indicator associated with the propagation path (m=3) (indicator (3)) is loaded with a value equal to the identification tag of the matching counter, i.e., 1, and the sub-symbol is routed to the accumulator identified by the value of the indicator associated with the propagation path (m=3) (indicator (3)=1) and the physical channel (c=1) of the received sub-symbol. In this case, the sub-symbol is routed and accumulated to accumulator $170(n)(c)$, i.e., accumulator$170(1)(1)$.

The second sub-symbol, of symbol y, from the first propagation path (m=1) (p1,sy2) is then received at time instant $t_{7B}$ (5 chips later than $t_{5B}$). The sub-symbol is determined to be the second sub-symbol or the second part of symbol y from the first propagation path (m=1) and the first physical channel (c=1) by the logic circuit 154 (step 226). Since the received sub-symbol is not the first sub-symbol received from the first propagation path (m=1) of the first physical channel (c=1), then the path delay of the sub-symbol (p1,sy2) is determined (i.e., 5 chips). The counters, as described hereinabove, automatically increment by one each chip period, thus counter (1) would have a value of 16 and counter (2) would have a value of 5, thus, the counter that contains the value that matches the path delay (in this case counter (2)) is selected. Since the sub-symbol (p1,sy2) is associated with the first propagation path (m=1), the indicator associated with the propagation path (m=1) (Indicator (1)) is loaded with a value equal to the identification tag of the matching counter, i.e., 2, and the sub-symbol is routed to the accumulator identified by the value of the indicator associated with the propagation path (m=1) (indicator (1)=2) and the physical channel (c=1) of the received sub-symbol. In this case, the sub-symbol is routed and accumulated to accumulator $170(n)(c)$, i.e., accumulator$170(2)(1)$.

At time instant $t_{8B}$ (7 chips later than $t_{5B}$), the second sub-symbol, of symbol y, from the second propagation path (m=2) (p2,sy2) is received. The sub-symbol is determined to be the second sub-symbol or the second part of symbol y from the second propagation path (m=2) of first physical channel (c=1) by the logic circuit 154 (step 226). Since the received sub-symbol is not the first sub-symbol received from the first propagation path (m=1) of the first physical channel (c=1), then the path delay of the sub-symbol (p2,sy2) is determined (i.e., 7 chips). The counters, as described hereinabove, automatically increment by one each chip period, thus counter(1) would have a value of 18 and counter(2) would have a value of 7, thus, the counter that contains the value that matches the path delay (in this case counter(2)) is selected. Since the sub-symbol (p2,sy2) is associated with the second propagation path (m=2), the indicator associated with the second propagation path (m=2) (indicator(2)) is loaded with a value equal to the identification tag of the matching counter, i.e., 2, and the sub-symbol is routed to the accumulator identified by the value of the indicator associated with the propagation path (m=2) (indicator (2)=2) and the physical channel (c=1) of the received sub-symbol. In this case, the sub-symbol is routed and accumulated to accumulator $170(n)(c)$, i.e., accumulator $170(2)(1)$.

At time instant $t_{9B}$ (8 chips later than $t_{5B}$), the first sub-symbol, of symbol y, from the third propagation path (p3,sy1) is received. The sub-symbol is determined to be the first sub-symbol or the first part of symbol x from the third propagation path (m=3) and the first physical channel (c=1) by the logic circuit 154 (step 226). Since the received sub-symbol is not the first sub-symbol received from the first propagation path (m=1) of the first physical channel (c=1), then the path delay of the sub-symbol (p3,sy1) is determined (i.e., 8 chips). The counters, as described hereinabove, automatically increment by one each chip period, thus counter(1) would have a value of 19 and counter(2) would have a value of 8, thus, the counter that contains the value that matches the path delay (in this case counter(2)) is selected. Since the sub-symbol (p3,sy1) is associated with the third propagation path (m=3), the indicator associated with the propagation path (m=3) (Indicator (3)) is loaded with a value equal to the identification tag of the matching counter, i.e., 2, and the sub-symbol is routed to the accumulator identified by the value of the indicator associated with the propagation path (m=3) (indicator (3)=2) and the physical channel (c=1) of the received sub-symbol. In this case, the sub-symbol is routed and accumulated to accumulator $170(n)(c)$, i.e., accumulator $170(2)(1)$.

At time instant $t_{10B}$ (13 chips later than $t_{5B}$), the second sub-symbol, of symbol y, from the third propagation path (p3,sy2) is received. The sub-symbol is determined to be the second sub-symbol or the second part of symbol y from the third propagation path (m=3) and the first physical channel (c=1) by the logic circuit 154 (step 226). Since the received sub-symbol is not the first sub-symbol received from the first propagation path (m=1) of the first physical channel (c=1), then the path delay of the sub-symbol (p3,sy2) is determined (i.e., 13 chips). The counters, as described hereinabove, automatically increment by one each chip period, thus counter (1) would have a value of 24 and counter (2) would have a value of 13, thus, the counter that contains the value that matches the path delay (in this case counter (2)) is selected. Since the sub-symbol (p3,sy2) is associated with the third propagation path (m=3), the indicator associated with the propagation path (m=3) (Indicator (3)) is loaded with a value equal to the identification tag of the matching counter, i.e., 2, and the sub-symbol is routed to the accumulator identified by the value of the indicator associated with the propagation path (m=3) (indicator (3)=2) and the physical channel (c=1) of the received sub-symbol. In this case, the sub-symbol is routed and accumulated to accumulator $170(n)(c)$, i.e., accumulator $170(2)(1)$.

Figure 6A:
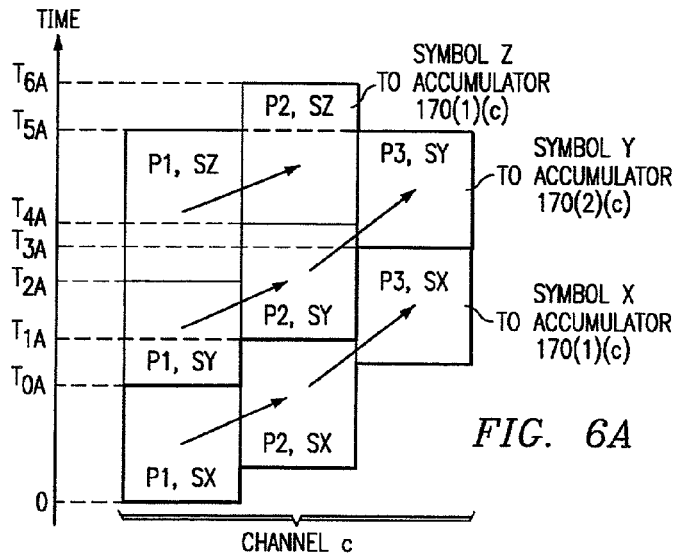
FIGS. 6A and 6B illustrate timing diagrams for the receipt and accumulation of the symbols of FIGS. 5A and 5B.
Figure 6B:
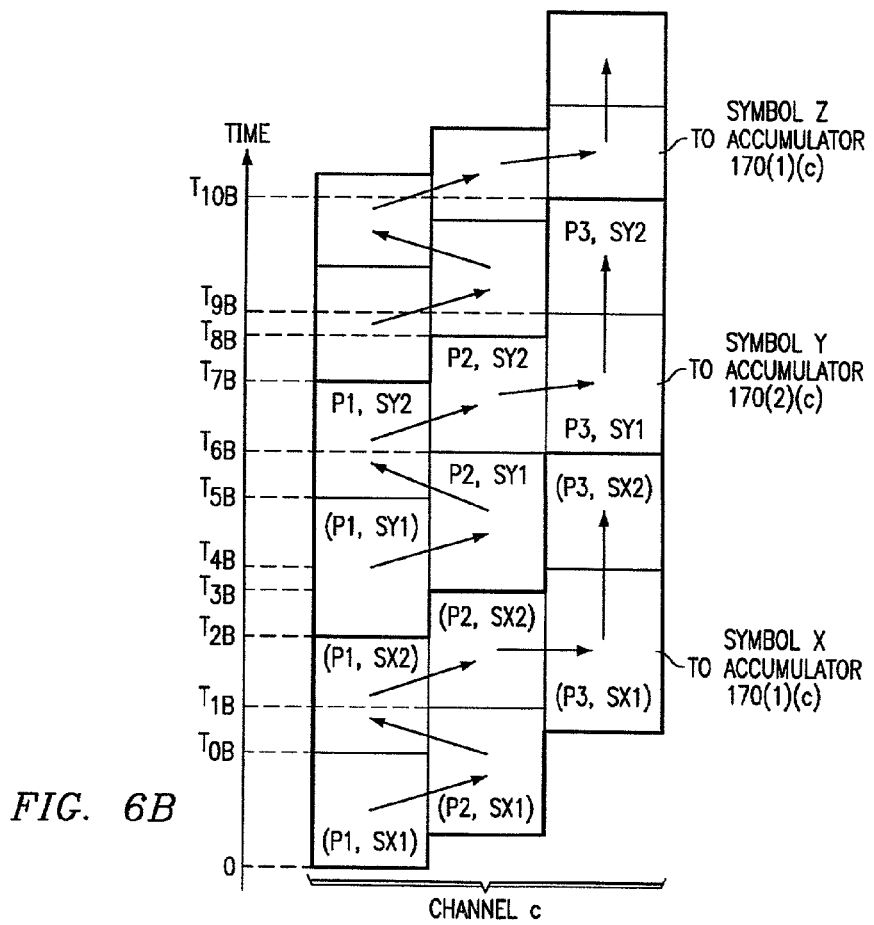

FIGS. 6A and 6B illustrate timing diagrams for the operation of the demodulator of FIGS. 3A and 3B for receipt of the symbols/sub-symbols of FIGS. 5A and 5B, respectively. The timing of the receipt of the symbols/sub-symbols and the operation of the system shown in FIGS. 5A and 5B match the timing and the operation illustrated in FIGS. 6A and 6B and the description associated with each Figure will not be repeated. Referring now to FIG. 6A, there is illustrated the example of FIG. 5A of the symbols received from a channel c over three propagation paths. Symbol x is received from the three propagation paths and all the occurrences of symbol x are routed and accumulated to the accumulator $170(1)(c)$, as shown by the arrows. The arrows in FIG. 6A show the order in which the symbols are accumulated to the same accumulator for a given physical channel (channel c). For example, as described with reference to FIG. 5A, symbols (p1,sx), (p2,sx), and (p3,sx) are all routed and accumulated to accumulator $170(1)(c)$ in the order they are received. Moreover, symbols (p1,sy), (p2,sy), and (p3,sy) are all routed and accumulated to accumulator $170(2)(c)$. The symbols (p1,sz) and (p2,sz) are routed and accumulated to the same first accumulator $170(1)(c)$ since the accumulator has already finished accumulating the symbols relating to symbol x and has provided the combination result of symbol x through the switch 180 and is thus ready to process additional symbols. It should be understood that the symbol combination process, as described hereinabove, ensures that overlapping symbols relating to different symbols (e.g., symbols x, y, or z) are accumulated in separate accumulators. For example, the second symbol, relating to symbol y, from the first propagation path (p1,sy) is received while the first accumulator is still processing the symbols relating to symbol x and thus symbol (p1,sy) cannot be processed by the first accumulator 170(1)(c) but is instead accumulated to a second accumulator 170(2)(c). Thus, in this example, at least two accumulators are required for each channel to achieve the symbol combination with a desired signal quality. It should be understood that more or fewer number of accumulators may be present in the accumulators of which only some are utilized in the symbol combination process.

Turning now to FIG. 6B, there is illustrated the example of FIG. 5B of the sub-symbols received from a channel c over three propagation paths. Six sub-symbols are received from the three propagation paths and all associated with symbol x. The sub-symbols are all routed and accumulated to the accumulator 170(1)(c), as shown by the arrows. The arrows in FIG. 6B show the order in which the sub-symbols are combined for a given physical channel (channel c). For example, as described with reference to FIG. 5B, sub-symbols (p1,sx1), (p2,sx1), (p1,sx2), (p2,sx2), (p3,sx1) and (p3,sx2) are all routed and accumulated to accumulator 170(1)(c) in the order they are received. Moreover, sub-symbols (p1,sy1), (p2,sy1), (p1,sy2), (p2,sy2), (p3,sy1) and (p3,sy2) are all routed and accumulated to accumulator 170(2)(c). It should be understood that the sub-symbol combination process, as described hereinabove, ensures that overlapping sub-symbols relating to different symbols (e.g., symbols x and y) are accumulated in separate accumulators. For example, the first sub-symbol, relating to symbol y, from the first propagation path (p1,sy1) is received while the first accumulator 170(1)(c) is still processing the sub-symbols relating to symbol x and thus sub-symbol (p1,sy1) cannot be processed by the first accumulator 170(1)(c) but is instead accumulated to a second accumulator 170(2)(c). However, the next received sub-symbol relating to symbol z are routed and accumulated to the same first accumulator 170(1)(c) since the accumulator has previously provided the combination result of symbol x through the switch 180 and is thus ready to process the sub-symbols associated with symbol z.

It should be understood that a plurality of channels may be utilized. In the examples provided hereinabove, there should be at least two accumulators for each channel to achieve an acceptable combination signal quality. However, more accumulators will guarantee a certain quality of service.

The exemplary embodiments of the present invention enable received symbol or sub-symbol to be routed and accumulated to an appropriate accumulator based on a value of an indicator and a channel identification of the symbol or sub-symbol. The indicator utilized in the routing of the symbol is identified by the propagation path of the symbol or sub-symbol.

As described hereinabove, the demodulator does not need any buffers to store the received symbols therein. This enables the system to reduce the power consumption since the buffers consume more power than other components in the demodulator. It should be noted that even though the number of accumulators within the demodulator of the present invention may be higher than conventional demodulations, the number of operations remains unchanged. This results in no more power consumption in the accumulators even though more accumulators are used.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A demodulator for demodulating a plurality of symbols, each of said plurality of symbols being associated with a physical channel and a propagation path, said demodulator comprising:
    a plurality of accumulators, each one of the plurality of accumulators capable of accumulating received symbols; and
    a multiplexer for routing each one of the plurality of symbols to an appropriate accumulator selected from the plurality of accumulators, said routing being based on the physical channel identification identifying the physical channel of a received symbol and a value of an indicator associated with the propagation path of the received symbol.

2. The demodulator of claim 1, further comprising a plurality of indicators coupled to the multiplexer for providing the value within the indicator associated with the propagation path of the received symbol, the indicators being associated with the propagation paths of the received symbols.

3. The demodulator of claim 1, wherein said multiplexer being configured to receive the value of the indicator and the physical channel identification identifying the physical channel.

4. The demodulator of claim 1, wherein the symbols comprise sub-symbols.

5. The demodulator of claim 1, wherein the demodulator is a Code Division Multiple Access (CDMA) demodulator.

6. The demodulator of claim 1, further comprising a plurality of counters, each configured to increment each chip period.

7. The demodulator of claim 6, wherein at least one of the counters is reset when the received symbol is associated with the first propagation path of the first channel.

8. The demodulator of claim 6, further comprising:
    a determiner for determining a path delay of the received symbol; and
    a selector for selecting one of the plurality of counters having a value equal to the determined path delay; and
    a loader for loading a tag identifier of the selected counter in the indicator associated with the propagation path of the received symbol.

9. The demodulator of claim 1, wherein the demodulator is within an integrated circuit chip.

10. A method for demodulating symbols in a wireless communication network, said method comprising the steps of:
    receiving a plurality of symbols, each of said plurality of symbols being associated with a physical channel and a propagation path;
    selectively routing each one of the plurality of symbols to an appropriate accumulator based on a physical channel identification identifying the physical channel of the received symbol and a value of an indicator associated with the propagation path of the received symbol; and accumulating each of the routed symbols to the appropriate accumulator.

11. The method of claim 10, further comprising, prior to the step of selectively routing, the step of:

loading a value in an indicator associated with the propagation path of the received symbol.

12. The method of claim 11, wherein the step of loading the value in the indicator further comprises the steps of:

determining a path delay of the received symbol; and selecting a counter having a value equal to the determined path delay, wherein the step of loading loads a tag identifier of the selected counter in the indicator associated with the propagation path of the received symbol.

13. The method of claim 10, wherein the wireless communication network is a CDMA wireless communication network or a WCDMA wireless communication network.

14. An integrated circuit chip within an electronic wireless communication device, said integrated circuit chip comprising:

a receiver for receiving a plurality of symbols, each of said plurality of symbols being associated with a physical channel and a propagation path;

a plurality of accumulators, each one of the plurality of accumulators capable of accumulating at least one of the plurality of symbols; and a circuit for routing each one of the plurality of symbols to an appropriate accumulator selected from the plurality of accumulators, said routing being based on a physical identification identifying the physical channel channel of the received symbol and a value of an indicator associated with the propagation path of the received symbol.

15. The integrated circuit chip of claim 14, wherein the circuit comprises a multiplexer, said multiplexer being configured to receive the value within the indicator associated with the propagation path of the received symbol and a physical channel identification of the physical channel and instantly route one of the received symbols to the appropriate accumulator.

16. The integrated circuit chip of claim 15, further comprising a plurality of indicators, each one of the indicators being associated with a propagation path.

17. The integrated circuit chip of claim 16, further comprising:

a determiner for determining a path delay of the received symbol; and a selector for selecting a counter having a value equal to the determined path delay; and a loader for loading a tag identifier of the selected counter in the indicator associated with the propagation path of the received symbol.

18. The integrated circuit chip of claim 14, wherein the wireless communication network is a Code Division Multiple Access (CDMA) communication network.

19. A method for demodulating symbols in a wireless communication system, said method comprising the steps of:

receiving at least one symbol, said received symbol associated with a physical channel and a propagation path;

loading a value in an indicator associated with the propagation path of the received symbol;

routing the received symbol to an accumulator selected from a plurality of accumulators based on the value of the indicator identified by the propagation path of the received symbol and on a physical channel identification identifying the physical channel of the received symbol; and accumulating the received symbol to an accumulator.

20. The method of claim 19, wherein the step of loading the value in the indicator further comprises the steps of:

determining a path delay of the received symbol; and selecting a counter having a value equal to the determined path delay, wherein the step of loading loads a tag identifier of the selected counter in the indicator associated with the propagation path of the received symbol.

21. The method of claim 19, further comprising selecting the indicator from a plurality of indicators, said selected indicator identified by the propagation path of the received symbol.

22. The method of claim 19, further comprising incrementing each of a plurality of counters at each chip period.

23. The method of claim 19, wherein the loading step further comprises the step of:

upon the determination that the received symbol is associated with a first propagation path and a first physical channel, incrementing the value of the indicator identified by the propagation path of the received symbol.

24. The method of claim 23, further comprising, after the loading step, the step of:

resetting a counter identified by the value of the incremented indicator if the received symbol is associated with the first propagation path and the first physical channel.

25. A system for performing symbol combination, said system comprising:

a logic circuit for determining a propagation path and a physical channel of each received symbols;

a plurality of counters configured to automatically increment at each time period, the plurality of counters being coupled to the logic circuit, a selected one of the counters is reset upon the determination that the received symbol is a new symbol received from a first propagation path of a first physical channel;

a plurality of indicators coupled to the counters, each one of the indicators is configured to be selectively loaded with an identification tag of one of the counters, each one of the indicators is associated with one propagation path;

an indicator selector for receiving the propagation path of the symbol from the logic circuit and providing as output a value contained within the indicator associated with the propagation path received from the logic circuit;

a plurality of accumulators configured to accumulate the symbols; and a multiplexer coupled to the logic circuit to receive the physical channel of the received symbol and coupled to the indicator selector to received the value of the indicator associated with the propagation path of the received symbol, the multiplexer is coupled to the accumulators and is configured to route the symbol to one of the accumulators based on the received physical channel and the received value of the indicator.

* * * * *

UNITED STATES PATENT AND TRADEMARK OFFICE
CERTIFICATE OF CORRECTION

PATENT NO. : 7,099,293 B2  
APPLICATION NO. : 10/136650  
DATED : August 28, 2006  
INVENTOR(S) : Stefano Cervini It is certified that error appears in the above-identified patent and that said Letters Patent is hereby corrected as shown below:

IN COLUMN 5, LINE 33

Please insert     --as to-- after "way"

IN COLUMN 16, CLAIM 1, LINE 22

Please replace     "the" with --a--before "physical channel"

IN COLUMN 17, CLAIM 14, LINE 31

Please delete     "channel" at beginning of line

Signed and Sealed this

Fifteenth Day of May, 2007

JON W. DUDAS  
*Director of the United States Patent and Trademark Office*

UNITED STATES PATENT AND TRADEMARK OFFICE
CERTIFICATE OF CORRECTION

PATENT NO. : 7,099,293 B2  Page 1 of 1
APPLICATION NO. : 10/136650
DATED : August 29, 2006
INVENTOR(S) : Stefano Cervini It is certified that error appears in the above-identified patent and that said Letters Patent is hereby corrected as shown below:

IN COLUMN 5, LINE 33

Please insert     --as to-- after "way"

IN COLUMN 16, CLAIM 1, LINE 22

Please replace     "the" with --a-- before "physical channel"

IN COLUMN 17, CLAIM 14, LINE 31

Please delete     "channel" at beginning of line

This certificate supersedes Certificate of Correction issued May 15, 2007.

Signed and Sealed this

Fifth Day of June, 2007

JON W. DUDAS
*Director of the United States Patent and Trademark Office*